US008822858B2

(12) United States Patent
Niu et al.

(10) Patent No.: US 8,822,858 B2
(45) Date of Patent: Sep. 2, 2014

(54) KEYBOARD DESIGN

(75) Inventors: James J. Niu, San Jose, CA (US);
Harold J. Welch, San Jose, CA (US);
Chad A. Bronstein, San Jose, CA (US);
Patrick Kessler, San Francisco, CA (US); Chris Ligtenberg, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 571 days.

(21) Appl. No.: 13/221,753

(22) Filed: Aug. 30, 2011

(65) Prior Publication Data
US 2012/0199455 A1    Aug. 9, 2012

Related U.S. Application Data

(60) Provisional application No. 61/441,148, filed on Feb. 9, 2011.

(51) Int. Cl.
*H01H 9/00* (2006.01)
*H01H 13/83* (2006.01)
*G03F 7/20* (2006.01)
*H01H 3/12* (2006.01)
*H01H 13/86* (2006.01)

(52) U.S. Cl.
CPC .......... *G03F 7/70733* (2013.01); *H01H 13/83* (2013.01); *H01H 2219/036* (2013.01); *H01H 3/125* (2013.01); *H01H 2227/028* (2013.01); *H01H 2223/036* (2013.01); *H01H 2221/03* (2013.01); *H01H 2219/064* (2013.01); *H01H 13/86* (2013.01)
USPC ...................................................... 200/308

(58) Field of Classification Search
CPC .... G03F 7/70733; H01H 13/83; H01H 13/86; H01H 2219/036; H01H 2219/064; H01H 2221/03; H01H 2223/036; H01H 2227/028; H01H 3/125
USPC ......... 200/308, 310, 5 A, 341, 344, 345, 512, 200/514; 400/490
See application file for complete search history.

(56) References Cited

U.S. PATENT DOCUMENTS 4,439,646 A * 3/1984 Bouvrande .................... 200/5 A
4,471,189 A * 9/1984 Bacon et al. .................. 200/516

(Continued)

FOREIGN PATENT DOCUMENTS

EP    1 321 955 A2    6/2003

OTHER PUBLICATIONS

International Search Report dated May 7, 2012 in PCT Application No. PCT/US2012/022450.

(Continued)

*Primary Examiner* — Edwin A. Leon
(74) *Attorney, Agent, or Firm* — Brownstein Hyatt Farber Schreck, LLP

(57) ABSTRACT

Embodiments of a backlit keyboard assembly are described. A keycap assembly is mounted into a case web having intersecting ribs. A flange, which can be angled, is on the bottom perimeter of the keycap and a correspondingly shaped flange is on each rib of the case web. An overlap of the keycap flange and the case web flanges prevents direct sighting of the backlight light source and also provides a more evenly distributed halo around the keycap, thereby improving both aesthetics and functionality by providing better light control and contrast.

21 Claims, 9 Drawing Sheets

(56) References Cited

U.S. PATENT DOCUMENTS

| | | | |
|---|---|---|---|
| 5,570,114 A * | 10/1996 | Fowler | 345/173 |
| 7,049,530 B2 | 5/2006 | Hayashizaki | |
| 7,745,751 B2 | 6/2010 | Takahashi et al. | |
| 2001/0046402 A1 | 11/2001 | Hasunuma | |
| 2003/0113153 A1 | 6/2003 | Lee et al. | |
| 2008/0006516 A1 | 1/2008 | Nishino et al. | |
| 2010/0089736 A1 | 4/2010 | Tsai et al. | |
| 2011/0018161 A1 | 1/2011 | Yang | |

OTHER PUBLICATIONS

Written Opinion dated May 7, 2012 in PCT Application No. PCT/US2012/022450.

* cited by examiner

KEYBOARD DESIGN

This application claims priority to and the benefit under 35 U.S.C. §119(e) of U.S. Provisional Application Ser. No. 61/441,148, filed Feb. 9, 2011, entitled KEYBOARD DESIGN, the entire disclosure of which is hereby incorporated herein by reference.

BACKGROUND OF THE INVENTION

1. Field of the Invention

The described embodiments relate generally to peripheral devices for use with computing devices and similar information processing devices. More particularly, the present embodiments relate to keyboards and keyboard assemblies and methods of assembling such keyboard assemblies. A keycap assembly can prevent backlight leakage and provide a more evenly distributed halo to improve the functionality and aesthetic appearance of the keyboard assembly.

2. Description of the Related Art

The outward appearance, as well as functionality, of a computing device and its peripheral devices is important to a user of the computing device. One design challenge associated with these devices, especially with backlit keyboards, is the difficulty balancing the desirability of providing backlight for a keyboard with controlling a halo effect around keys to improve user functionality as well as preventing backlight leakage (direct sighting of the backlight light source).

Therefore, it would be beneficial to provide a backlit keyboard mechanism comprising a keycap assembly for controlling the halo effect and for preventing backlight leakage. Such a keyboard can be used in the dark and preventing the direct light leakage also allows the key legend and halo brightness and contrast to be controlled more precisely. Prevention of direct sighting of the keyboard backlight light source by the user therefore would improve both aesthetics and performance.

SUMMARY OF THE DESCRIBED EMBODIMENTS

This paper describes various embodiments that relate to systems, methods, and apparatus for providing a backlit keyboard that with controlled halo brightness and contrast.

In one embodiment, a backlit keyboard assembly includes a keycap assembly mounted in a case web at an aperture formed by intersecting ribs of the case web. The keycap assembly has a flange around a perimeter of the bottom of the keycap and an internal stopping mechanism for stopping the keycap at a designed height. Each rib has a case web flange having a geometry corresponding to that of the keycap flange, and the keycap flange and the case web flange do not contact each other. When the internal stopping mechanism stops the keycap at the designed height, an overlap between the keycap flange and case web flange prevents direct visibility of a backlight light source by a user allowing a legend and halo brightness and contrast to be controlled more precisely.

In another embodiment, a keyboard is described. The keyboard includes a keycap and a case web in which the keycap is mounted. The case web includes intersecting ribs that have case web flanges. The keycap assembly includes at least a keycap having a keycap flange attached to a bottom perimeter of the keycap, a scissor-type mechanism for supporting the keycap, a rubber dome underneath the keycap for providing tactile feel to a user, a layered membrane with switch circuit, a base plate for support of the keycap assembly, and a backlight light source underneath the base plate. The keycap flange and case web flanges overlap but do not contact each other such that the backlight light source cannot be directly seen by the user. A vertical stop pin can also be attached to a pivot of the scissor mechanism, and a stopping mechanism can also be provided for restricting vertical motion of the vertical stop pin at a predetermined distance from the base plate.

According to still another embodiment, a method of making a keyboard is described. A base plate having a backlight light source underneath the base plate can be provided. The base plate is then engaged with a scissor type mechanism, which is engaged with a keycap having a keycap flange around a perimeter of a base of the keycap. A case web is positioned over the keycap such that a case web flange corresponds to the keycap flange without contacting the keycap flange, wherein an overlap of the case web flange and the keycap flange prevent a user from directly seeing the backlight light source.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EXAMPLE EMBODIMENTS

Figure 1:
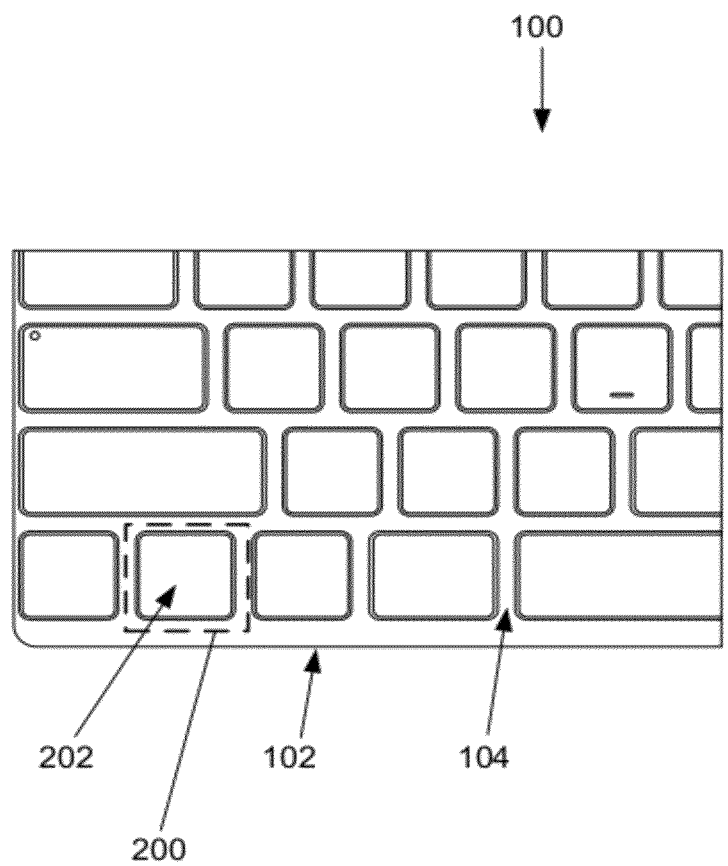
FIG. 1 shows a portion of a keyboard having a webbed design installed in its receiving case.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

The keycap assembly prevents the backlight light source from being seen by a user around the perimeter of the keycap. The keycap assembly can be mounted into a case web formed of intersecting ribs, each of which has a corresponding flange. When an internal key mechanism, such as, for example, a scissor mechanism or other vertical stop mechanism, stops the keycap at a designed height, an overlap between the keycap and web flange can prevent backlight leakage by preventing direct visibility of the light source by the user. The overlap between the keycap and web flange can also cause the halo around the keycap to be more evenly distributed, and thereby more aesthetically pleasing and functional. In an embodiment, the flange can be angled.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The keyboard design and integration method has unique features in the keycap and receiving cases to shut off light leakage from the backlight light source and also enables better control of the halo effect around the keycap. This greatly improves the product aesthetics, backlight performance, and user experience. The proper arrangement of the light blocking features in an embodiment of a keyboard prevents direct sighting of the backlight light source by the user. The fact that the backlight can be seen only from the top through key legends and an evenly distributed halo around the key translates to better backlight performance and control. Without the control of light around the perimeter of the individual keys, direct sighting of the backlight light source can greatly interfere with the proper brightness and contrast intended for the backlit key legends.

This design and integration scheme also has the advantage of imposing no mechanical interaction between keycaps and receiving case, with the blockage of direct sighting of the light source solely achieved by the properly designed geometry. Thus, in the described embodiments, the keycaps and the receiving case do not have to contact one another in order to block direct sighting of the light source. In prior alternative attempts to block direct sighting of the light source, the mechanical interaction between keys and receiving cases causes unpleasant acoustic noise, changes in the tactile feel of the keys, as well as increased wear and tear of the keyboard.

The design is distinct in the utilization of a flange, which can be angled in some embodiments, on the bottom perimeter of each keycap and the matching cut and flange in the receiving case. The unique internal key mechanism that stops the key at the designed height makes such arrangement feasible and achievable in mass production.

These and other embodiments of the invention are discussed below with reference to FIGS. 1-8. However, those skilled in the art will readily appreciate that the detailed description given herein with respect to these figures is for explanatory purposes as the invention extends beyond these limited embodiments.

FIG. 1 shows a portion of a keyboard 100 installed in its receiving case 102. The keyboard 100 has a webbed design and has case webs 104 in between individual keys 202. The keyboard shown in FIG. 1 can also be backlit so that the key legends on the keycaps 202 can be seen in a dark environment. It will be understood that the backlit key legends can be a transparent or translucent portion of the keycap through which light from a light source can be seen by a user. A halo of light around the perimeter of each keycap 202 can help a user see the edges of the keycap 202 in dim light.

Figure 2:
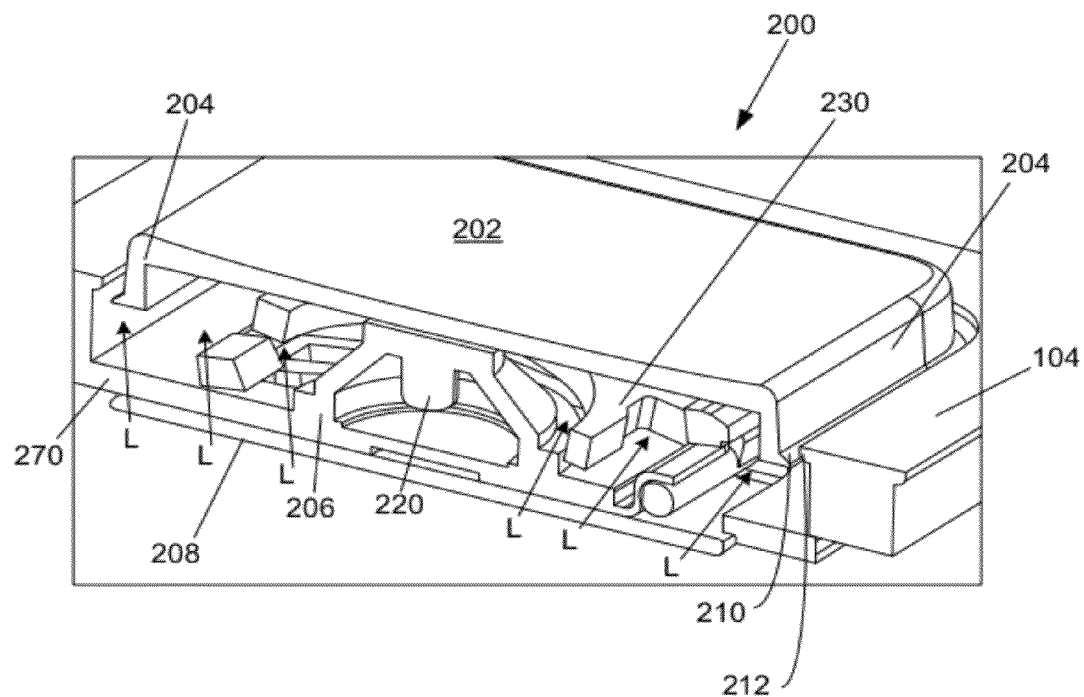
FIG. 2 shows internal details of the key section shown in FIG. 1 showing a cross-section of key, case web, internal key mechanism, and backlight.

FIG. 2 shows an embodiment and its internal details of a key switch section 200 shown in FIG. 1. The keycap 202 can be held in place by a key supporting mechanism or base plate 270 and can also supported by a scissor type mechanism 230 and a rubber or elastomeric dome 206 positioned under the central portion of the keycap 202. As shown in FIG. 2, the keycap 202 has a side wall 204 around its perimeter that extends downward. The scissor type mechanism 230 can include two linkage pieces that interlock in a "scissor"-like manner, as shown in more detail in FIGS. 4-6. The scissor type mechanism 230 is typically formed of a rigid material, such as plastic or metal or composite material, as it provides mechanical stability to the key switch. The rubber dome 206 can be formed of an elastomeric material, such as silicone, and can provide the tactile force and feedback to the user needed for proper key feel.

When the keycap 202 is depressed by a user, the keycap 202 pushes down on the rubber dome 206 sitting beneath the keycap 202. The rubber dome 206 collapses, which gives tactile feedback to the user depressing the keycap 202. The rubber dome 206 can also dampen the keystroke in addition to providing the desired tactile response. The collapsing rubber dome 206 causes a pair of conductive lines on a printed circuit board (PCB) below the dome 206 to can contact a membrane, which serves as the electrical component of the switch. The collapsing rubber dome 206 depresses the membrane and closes the electrical switch. The membrane can be, for example, a three-layer membrane or other type of PCB membrane. A chip in the keyboard can emit a scanning signal along the pairs of lines on the PCB to all the keys. When the signal in one pair of lines changes due to the contact, the chip generates a code corresponding to the key connected to that pair of lines. This code is sent to the electronic device, which can, for example, be a computer, either through a keyboard cable or over a wireless connection, where it is received and decoded into the appropriate key. The computer then decides what to do based on the particular key depressed, such as display a character on the screen, or perform some other type of action.

As shown in FIG. 2, the rubber dome 206 is substantially concave or hemispherical and oriented such that the vertex of the dome is at the highest point. In other words, the rubber dome 206 is positioned with the dome opening facing downward. As the dome is concave, it is a normally-open tactile switch. The switch only closes when the dome 206 is collapsed, as will be described in more detail below. It will be understood that although the illustrated embodiments show a substantially hemispherical dome, the elastomeric structure, in other embodiments, may also have other shapes, including, for example, rectangular or box shape, conical, truncated conical, and other shapes capable of similar deformation from the typical force applied to a key pad. In an alternative embodiment, the dome can be formed of a metal material. According to another embodiment, stacked metal and elastomeric domes may be provided in place of a single elastomeric dome.

As shown in FIG. 2, the rubber dome 206 can include a plunger portion 220 that extends downward from the center of the underside of the rubber dome 206. The plunger 220 portion of the rubber dome 206 is positioned directly over the contact pads 258 (FIG. 9) of the circuit traces of the membrane 250. Thus, when the rubber dome 206 is compressed, the plunger 220 contacts and pushes down on the top side of the top layer 252 (FIG. 9) of the membrane 250, thereby causing the contact pads 258 of the circuit traces (FIG. 9) on the top layer 252 (FIG. 9) and the bottom layer 256 (FIG. 9) of the membrane 250 to connect and close the switch, which completes the connection to enter the character or perform the function of the key. As shown in FIG. 2, the plunger 220 is a portion of the rubber dome 206 that does not contact the top side of the top layer 252 (FIG. 9) of the membrane 250 when the rubber dome 206 is in a relaxed state. It will be understood that the underside of the center of the rubber dome 206 does not contact the top side of the top layer 252 (FIG. 9) of the membrane 250 when the rubber dome 206 is in a relaxed state.

As shown in FIG. 2, a backlight light source 208 can be provided. In a typical backlit key switch, the light source can also emit stray light around the perimeter of the keycap 202, thereby creating a halo effect. In the illustrated embodiment, the backlight light source 208 is positioned under the base plate 270 and the light emitted from the light source 208 can illuminate the translucent legend on the keycap 202 and also provide a controlled halo around the perimeter of the keycap 202. The light can be emitted from the light source 208 as shown by arrows L, for example, in FIG. 2. It will be understood that at least a portion of the base plate 270 can be cut or translucent to allow light from the light source 208 to pass through the base plate 270. The legend can be etched as a translucent portion in the keycap 202 to allow light to be transmitted therethrough. The area around the perimeter of the keycap 202 can also allow direct sighting by a user of the backlight light source 208. As mentioned above, such direct sighting of the light source 208 is undesirable. The unique geometries of an embodiment, as described in more detail below, can prevent direct sighting of the light source 208 and can also control the halo effect so that it is more aesthetically pleasing as well as functional.

The unique geometries implemented in the embodiment shown in FIG. 2 include an angled flange 210 around the perimeter at the bottom or base of the keycap 202, and a corresponding flange 212 on the case web 104. When the keycap 202 is in its normal resting position, the angled flange 210 on the keycap 202 is close to but not in contact with the corresponding flange 212 on the case web 104. When an internal key mechanism, such as the scissor mechanism 230 or other vertical stop mechanism, stops the keycap 202 at the designed height, the overlap between the keycap 202 and web 104 prevents the light from the backlight light source 208 from being directly visible by the user. The blockage of the direct light leakage also allows the legend and halo brightness and contrast to be controlled more precisely.

Figure 3A:
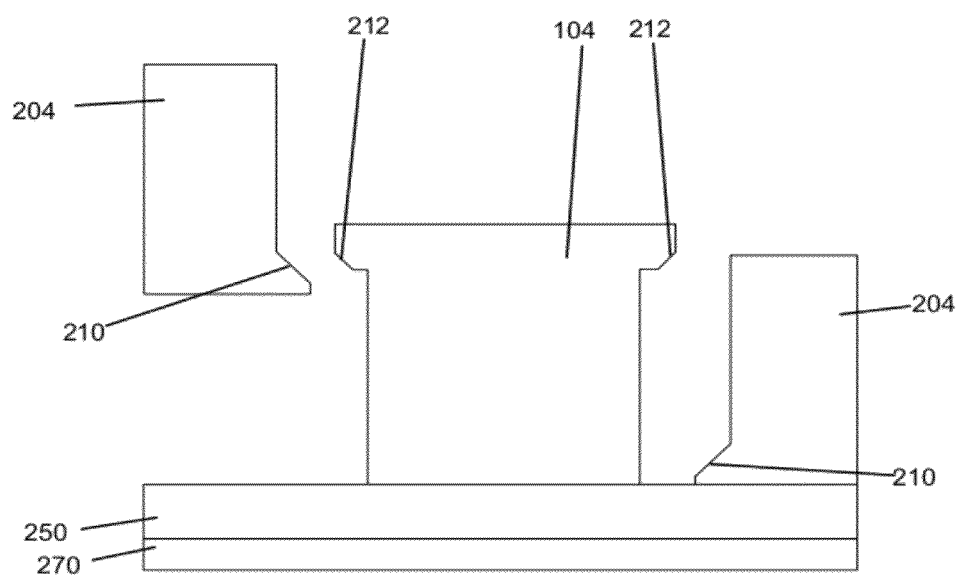
FIGS. 3A and 3B show a base design and an alternative flange geometry and material of a keycap flange.
Figure 3B:
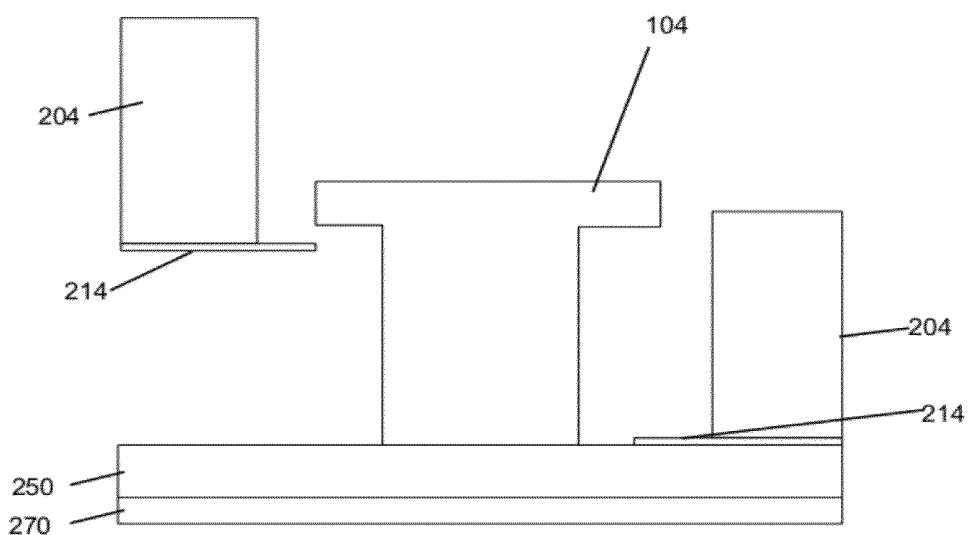

FIGS. 3A and 3B show variations in the general design concept. FIGS. 3A and 3B are simplified side views showing different embodiments of the flange design and corresponding portions of the receiving case. More specifically, FIG. 3A shows a design, such as the one shown in FIG. 2, with an angled flange around the perimeter of the base of the keycap whereas FIG. 3B shows an alternative design with a flange that is not angled. It should be noted that the basic concept shown in FIGS. 3A and 3B can be applied to specific versions of keyboard design with different key height, travel, keycap material, web material, web size, etc. Both of the keys in the embodiments shown in FIGS. 3A and 3B can have a total travel in the z-direction of about 1.5 mm. In both of the illustrated embodiments, when it is depressed by a user, the keycap 202 comes to a rest when the bottom of the keycap 202, with the flange 214 in FIG. 3B, contacts the base plate 270 with the membrane 250.

In the embodiment shown in FIG. 3B, the flange 214 is not angled. The flange 214 in the embodiment shown in FIG. 3B can be a sheet of polyethylene terephthalate (PET) polymer that is attached to the bottom surface of the side wall 204 of the keycap 202. According to an embodiment, this PET sheet can have a thickness of about 0.05 mm. As shown in FIG. 3B, the flange 214 extends away from the center of the key switch 200 such that the flange 214 extends beyond the edge of the side wall 204 of the key cap 202.

In an embodiment, the scissor type mechanism 230 can control the vertical movement or height of the keycap 202 when the keycap 202 is depressed by the user by stopping the keycap 202 from being pushed further down. The movement of the scissor type mechanism is described in more detail below with reference to FIGS. 4 and 5. The case web 104 can have an angled flange as shown in FIG. 3A or a flange that is not angled as shown in FIG. 3B. In FIG. 3A, the angled flange of the case web 104 corresponds with the angled flange 210 of the keycap 202. In FIG. 3B, the flange of the case web 104 corresponds with the flange 214 of the keycap 202.

The aesthetic appearance of a keyboard depends greatly on the keycaps as well as the receiving case, which form most of the visible portion of a keyboard. Thus, the proper arrangement of the light blocking features in the described embodiments prevents direct sighting of the backlight light source by the user, thus improving both aesthetics and performance. Seeing the backlight only from the top through key legends and a substantially even distribution of the halo around the key translates to better backlight performance and control. Without the shut off of light leakage, direct sighting of the backlight light source greatly interferes with the proper brightness and contrast intended for the back-lighted keys.

The designs and integration schemes described herein also have the advantage of imposing no mechanical interaction between keys and receiving case with the shut off solely achieved by the properly designed geometry. In prior alternative attempts to shut off the light, the mechanical interaction between keys and receiving cases causes unpleasant acoustic noise and changes in key feel.

The design shown in FIGS. 2 and 3A is distinct in the utilization of an angled flange on the bottom of a keycap and the matching cut and flange in the receiving case. A unique internal key mechanism that stops the key at the designed height makes such an arrangement feasible and achievable in mass production.

Figure 4:
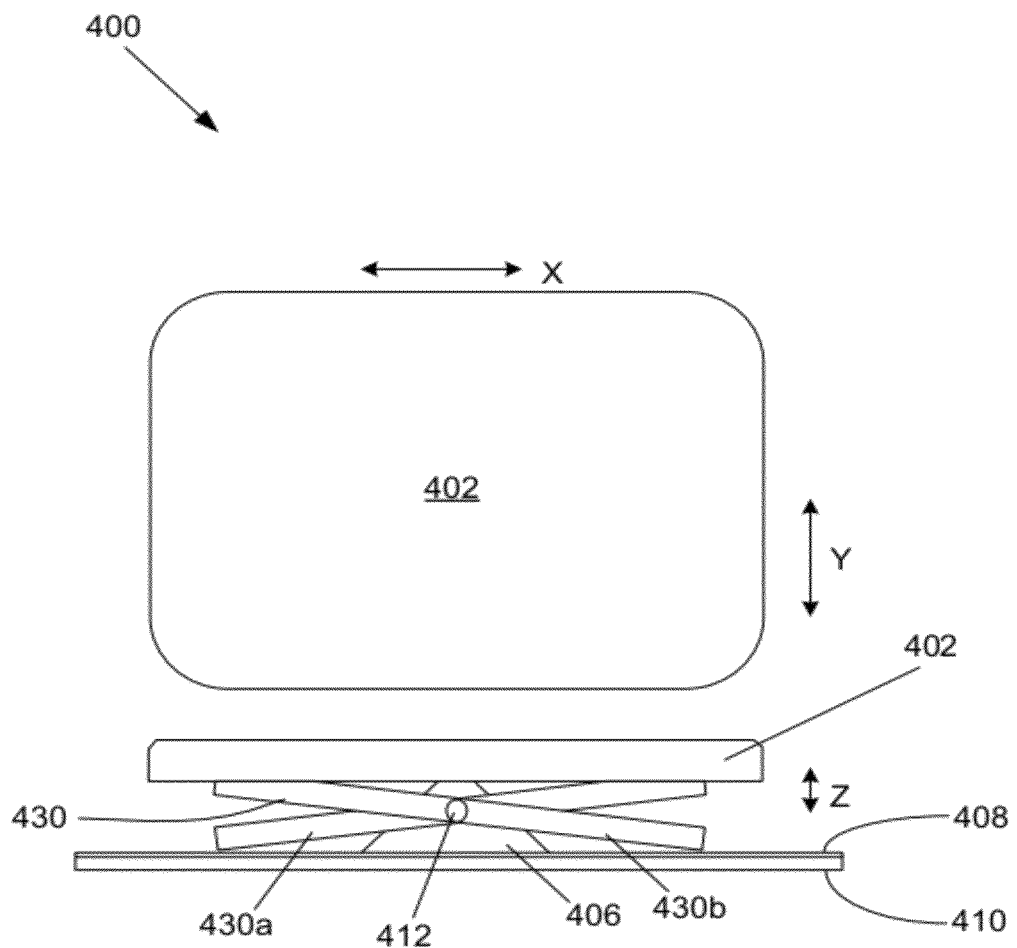
FIG. 4 shows a conventional keycap assembly.

The described embodiments involve a keyboard key design that utilizes a unique vertical stop mechanism to provide precision control of the key height. Precise control of the key height can provide more precise control of the overlap of the keycap flange and correspondingly shaped web case flange, which in turn allows more precise control of the light around the perimeter of the keycap. FIG. 4 shows a typical key that includes a scissor-type mechanism. As shown in FIG. 4, most keyboards used today in desktop and notebook computers consist of a keycap assembly 400 having keycap 402, a scissor-type mechanism 430 for structural stability, a rubber dome 406 for tactile force, a layered membrane with switch circuit 408, and a base plate 410 that holds all of these components in place. (X, Y, and Z coordinates are used here to help describe the construction and movement of the key).

The scissor type mechanism 430 regulates the up and down movement of the key 402. Normally, the two linkage structures 430a, 430b of the scissor type mechanism 430 are joined in the center with a pivot center 412. The scissor type mechanism 430 can maintain the desired keycap height relative to the base plate 410. In other words, the scissor type mechanism 430 helps to maintain the desired distance between the keycap 402 and the base plate 410.

As shown in FIG. 4, in a typical scissor type mechanism 430, each linkage structure 430a, 30b can have at least one end that slides when the key cap 402 is pressed down in the Z direction. The distance that the sliding ends of the linkage structures 430a, 430b move along the base plate 410 can be limited by a stopper feature on the base plate 410. The linkage structures 430a, 430b can be engaged with such features of the base plate 410 to define a resting position for the linkage structures 430a, 430b when the key switch is in a relaxed state.

According to an embodiment, each of the linkage structures 430a, 430b can be rotatably engaged with the key cap 402 and slidably engaged with the base plate 410. The upper ends of the linkage structures 430a, 430b can be rotatably engaged with features 450 (FIG. 5) on the underside of the keycap 402. The upper ends of the linkage structures 430a, 430b can be snapped into the features 450 (FIG. 5) on the underside of the keycap 402. The lower ends of the linkage structures 430a, 430b can be engaged with features 460 (FIG. 5) of the base plate 410. Such features can be, for example, hook-shaped structures on the base plate 410.

The scissor type mechanism 430 may be formed of a material, such as a plastic resin. In one embodiment, a plastic resin, such as polyoxymethylene (POM), may be used to form the scissor type mechanism 430. POM has some characteristics that make it a good choice for the material for the scissor type mechanism 430. POM can provide the strength necessary for the scissor type mechanism 430 to withstand the load from the keycap 402 as the user presses down on the key. POM also has good lubricity, so it functions well as a bearing against materials such as ABS and metal. As the scissor type mechanism 430 has a movable linkage structure, the lubricity of POM prevents the scissor type mechanism 430 from wearing too quickly. In other embodiments, the scissor type mechanism 430 may also be formed of another material, such as metal or composite material, such as glass-filled plastics.

As noted above, the scissor type mechanism 430 can be constrained to move within a range by some features, such as hooks and bends, made in the base plate 410 (also sometimes called feature-plate). As discussed above, the scissor type mechanism 430 can snap into the keycap 402, which moves up and down with the scissor type mechanism 404, which moves in a scissor-like action. In the embodiment shown in FIG. 4, the keycap 402 stops at its up position when a stop feature (not shown) in the base plate 410 stops one end of the scissor mechanism's 430 movement in the x direction. The stopper stops the movement of the scissor type mechanism 430 in the x-direction in order to stop the vertical motion in the z-direction. Due to the shallow angle at which the scissor type mechanism 430 operates, the ratio of the motion in the x direction to that in the z direction is near 1:10. Thus, the manufacturing error built into the stopper translates to ten times as much in the z height. Such 1:10 ratio is not desirable because the manufacturing tolerance results in much larger z height tolerances. It also indirectly impacts the tilt of the keycap 402 due to random tolerances built in various parts.

Figure 5:
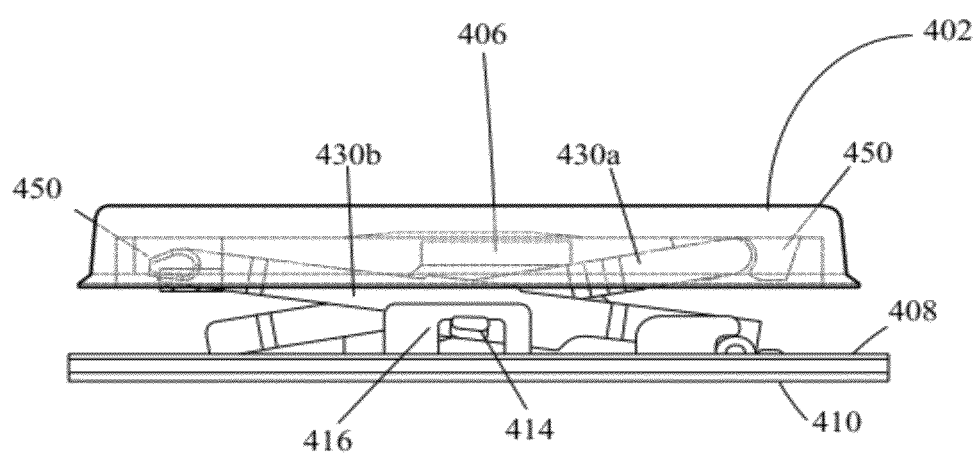
FIG. 5 shows a keycap assembly in accordance with a described embodiment.

As shown in FIG. 5, in order to reduce the 1:10 ratio, a unique vertical stop mechanism can be provided for precision control of the key height. The vertical stop mechanism, in this embodiment, can include a stop pin 414 and a hook 416. The stop pin 414 can be extended from the pivot center of the scissor type mechanism 430, and a hook 416 can be added in the base plate 410 to capture the stop pin 414. Since the stopper hook 416 of the base plate 410 stops the scissor type mechanism 430 from moving further up, it directly stops the scissor type mechanism 430 from moving vertically in the z direction, instead of relying on a stopper in the x-direction to stop the vertical z direction motion (as is described above). Such an arrangement can reduce the ratio of the motion in the x direction to that in the z direction from 1:10 down to 1:2. Besides the benefit of a reduced ratio, this vertical stop mechanism 414, 416 acts internally so there is no interaction with external parts of the system. Such external interaction has proven to be detrimental to the key characteristics in both acoustics and tactile feel of the key and should be avoided.

Figure 6:
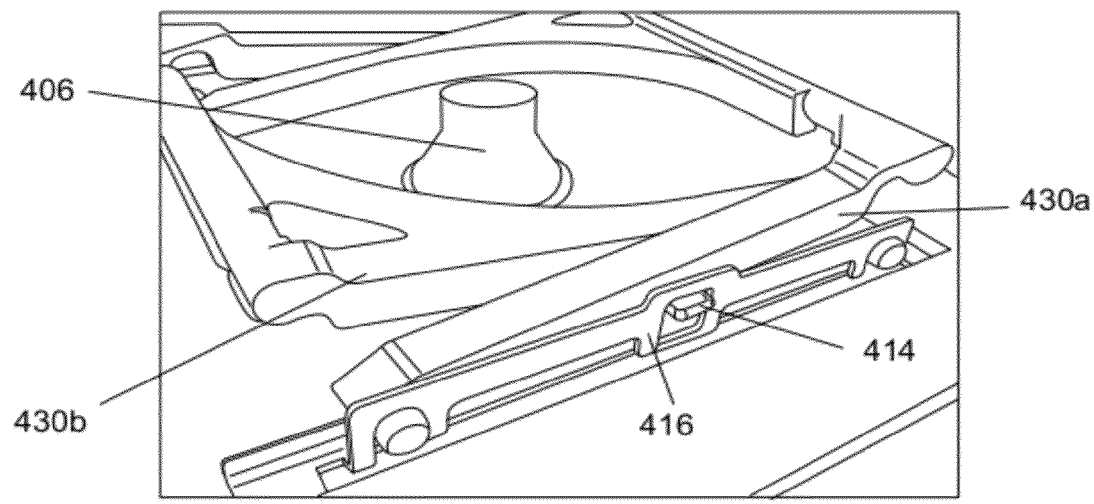
FIG. 6 shows another embodiment of keycap assembly.

FIG. 6 shows a perspective view of an alternate embodiment of a scissor type mechanism and vertical stop mechanism details, with the keycap removed. The scissor type mechanism 430 and the corresponding hook 416 that captures the stopper pin 414 can vary from design to design, but the basic concept of vertically stopping the motion is substantially the same. In the embodiment shown in FIG. 6, the scissor type mechanism 430 works differently from the one described above and shown in FIG. 5, and the hook 416 shape in the base plate is also different. In this embodiment, the scissor type mechanism 430 engages with the hook 416 at the ends and at the pin 414, as shown in FIG. 6. In the embodiment shown in FIG. 6, the vertical stop mechanism is positioned at the pivot center of the scissor type mechanism 430 and the 1:2 ratio of the motion in the x-direction to that in the z-direction is achieved the same way as in the embodiment of FIG. 5.

Figure 7:
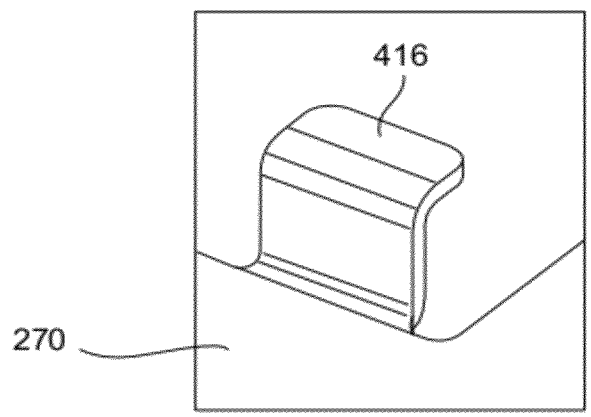
FIG. 7 shows another embodiment of a hook for limiting movement of a stopper pin of the scissor mechanism.
Figure 8:
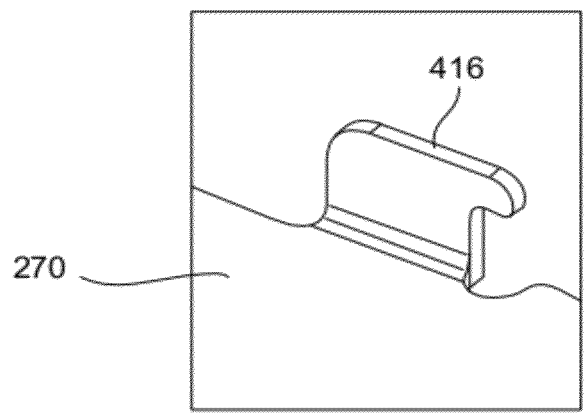
FIG. 8 shows yet another embodiment of the hook for limiting movement of a stopper pin of the scissor mechanism.

Another embodiment of the hook 416 is shown in FIG. 7. According to this embodiment, the hook 416 is a bend feature that provides a flat stop surface. Yet another embodiment of a hook 416 is shown in FIG. 8. As can be appreciated, the hook 416 and stopper pin 414 can be attached to or integral with the base plate, and can have different shapes.

Figure 9:
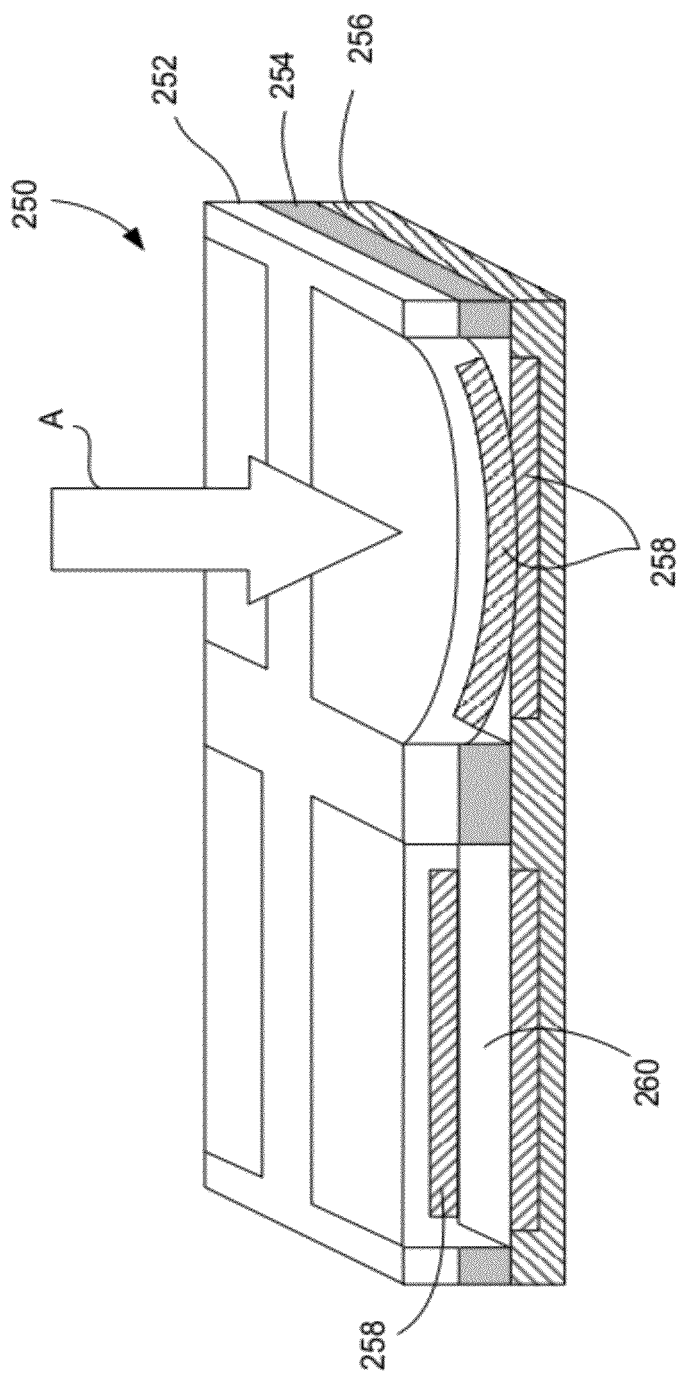
FIG. 9 is a detailed perspective view of an embodiment of a three-layer membrane of a printed circuit board.

FIG. 9 is a detailed perspective view of an embodiment of the membrane 250. According to an embodiment, the membrane 250 can have three layers, including a top layer 252, a bottom layer 256, and a spacer layer 254 positioned between the top layer 252 and the bottom layer 256. The top layer 252 and the bottom layer 256 can include conductive traces and their contact pads 258 on the underside of the top layer 252 and on the top side of the bottom layer 256, as shown in FIG. 9. The conductive traces and contact pads 258 can be formed of a metal, such as silver or copper. As illustrated in FIG. 9, the membrane sheet of the spacer layer 254 includes voids 260 to allow the top layer 252 to contact the bottom layer 256 when the elastomeric dome 220 is collapsed. According to an embodiment, the top layer 252 and bottom layer 256 can each have a thickness of about 0.075 µm. The spacer layer 254 can have a thickness of about 0.05 µm. The membrane sheets forming the layers of the membrane 250 can be formed of a plastic material, PET polymer sheets. According to an embodiment, each PET polymer sheet can have a thickness in the range of about 0.025 mm to about 0.1 mm.

Under "normal" conditions when the key pad is not depressed by a user (as shown on the left side of FIG. 9), the switch is open because the contact pads 258 of the conductive traces are not in contact. However, when the top layer 252 is pressed down by the elastomeric dome 220 in the direction of arrow A (as shown on the right side of FIG. 9), the top layer 252 makes contact with the bottom layer 256. The contact pad 258 on the underside of the top layer 252 can then contact the contact pad 258 on the bottom layer 256, thereby allowing the current to flow. The switch is now "closed", and the computing device can then register a key press, and input a character or perform some other operation. It will be understood that other types of switch circuitry can be used instead of the three-layer membrane 250 described above.

Figure 10:
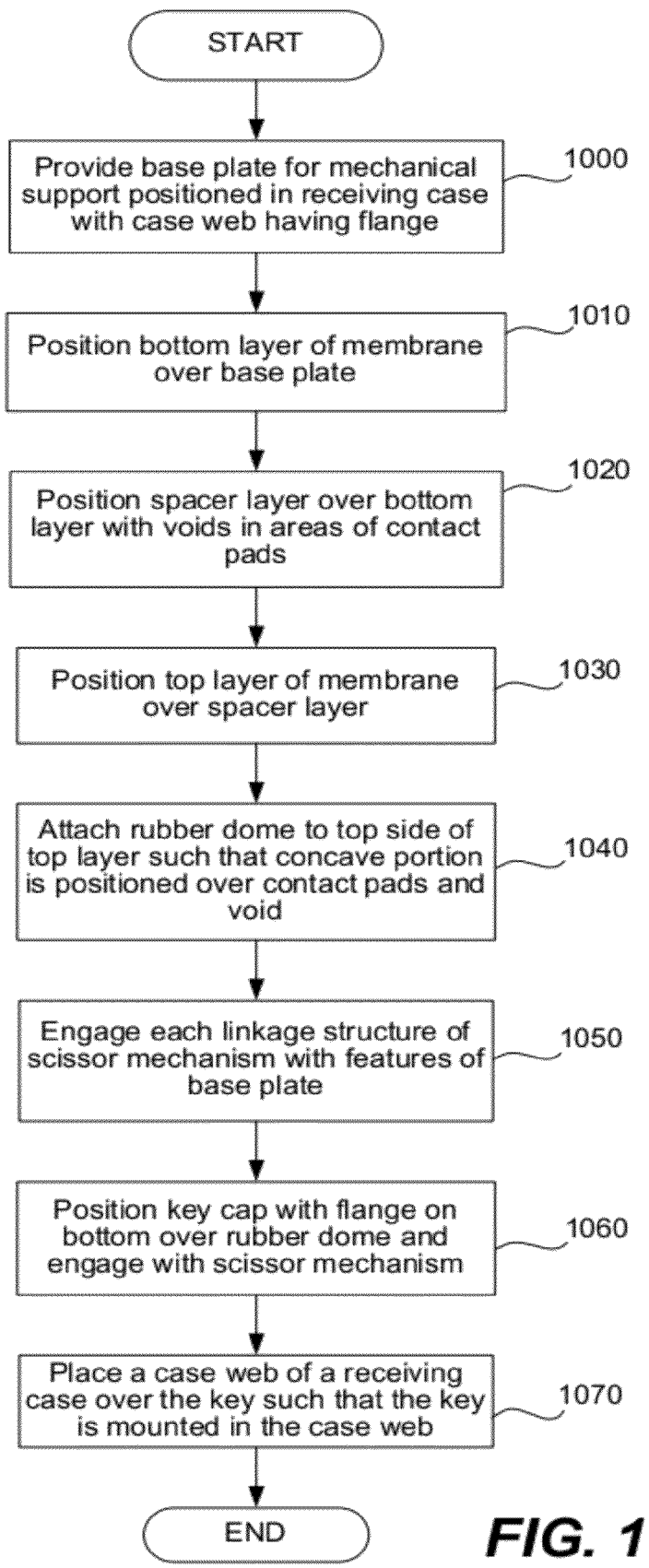
FIG. 10 is a flow chart of a method of assembling an embodiment of a key switch with controlled halo brightness and contrast.

A process for assembling the key switch 200 will be described with reference to FIG. 10. A process for assembling the components of the key switch 200 will be described below with reference to steps 1000-1070. In step 1000, a base plate 270 is provided for mechanical support for the PCB as well as the entire key switch 200. In one embodiment, the base plate 270 is formed of stainless steel. In other embodiments, the base plate 270 can be formed of aluminum. According to an embodiment, the base plate 270 has a thickness in a range of about 0.2 mm to about 0.5 mm.

A process for forming a three-layer membrane 250 on the base plate 270 will be described below with reference to steps 1010-1030. In step 1010, the bottom layer 256 of the membrane 250 can be positioned over the base plate 270 with a backlight light source 208 positioned under the base plate 270. Next, in step 1020, the spacer layer 254 can be positioned over the bottom layer 256 such that the voids 260 are in the areas of the contact pads 258. In step 1030, the top layer 252 can be positioned over the spacer layer 254 such that the contact pads 258 on the underside of the top layer 252 are positioned directly over the contact pads 258 on top side of the bottom layer 256 so that they can contact each other when the metal dome 240 is deformed. The layers 252, 254, 256 can be laminated together with adhesive. It will be understood that steps 1010-1030 can be combined into a single step by providing a three-layer membrane 250 that is pre-assembled or pre-laminated. The membrane 250 is positioned over the base plate 270 and held in place by one or more other components of the key switch 200, such as the scissor type mechanism 230.

According to this embodiment, in step 1040, the rubber dome 206 can be attached to the top side of the top layer 252 of the membrane 250 such that the concave dome portion is positioned over the contact pads 258 and the void 260. In step 1050, each linkage structure 230a, 230b of the scissor type mechanism 230 is then engaged with features of the base plate 270. In step 1060, to complete the key switch 200, the keycap 210 with a flange on its bottom is positioned over the rubber dome 206 and the scissor mechanism 230, and engaged with the scissor type mechanism 230. The scissor type mechanism 230 can be rotatably engaged with the keycap 202 by snapping the linkage structures 230a, 230b into features, such as grooves, on the underside of the keycap 202.

In step 1070, a case web of a receiving case is placed over the key 200 such that the key is mounted in the case web. The case web has intersecting ribs that form apertures in which keycaps 202 can be positioned. It will be noted that the keycap 202 has a flange, which can be angled, around the perimeter of the bottom of the keycap 202 that corresponds to a flange of the case web of the receiving case. An angled flange in the receiving case can be a chamfered surface. The geometry of the corresponding flanges of the keycap and case web can prevent direct sighting of the keyboard backlight light source, and can also causes the halo around each key 200 to be more evenly distributed and controlled.

The described embodiments' big advantage over existing designs is achieving a much smaller ratio of position tolerance. In applying this to a keyboard design, the key height and tilt tolerance due to tolerances in manufactured components can be reduced. By providing a positive and more accurate z height control, it can open up design space in innovative keyboard designs. The design is distinct in the utilization of pins near the pivot point of the scissors and corresponding hooks to create a positive and precision vertical height control.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A backlit keyboard, comprising:
   a keycap assembly including:
      a keycap having a keycap flange around a perimeter of a bottom of the keycap; and
      an internal stopping mechanism for stopping the keycap at a designed height when the keycap is pushed down by a user; and
   a case web comprising a plurality of intersecting ribs, wherein the keycap assembly is mounted into the case web at an aperture formed by the intersecting ribs, wherein each rib has a case web flange having a geometry corresponding to that of the keycap flange, wherein the keycap flange and the case web flange do not contact each other and an overlap between the keycap flange and case web flange prevents direct visibility of a backlight light source by a user allowing a legend and halo brightness and contrast to be controlled more precisely.

2. The keyboard of claim 1, wherein the internal stopping mechanism comprises a scissor type mechanism.

3. The keyboard of claim 1, wherein the internal stopping mechanism comprises:
   a stop pin extending from a pivot center of the scissor type mechanism; and
   a hook attached to a base plate to capture the stop pin.

4. The keyboard of claim 3, wherein the internal stopping mechanism can directly stop the scissor type mechanism from moving vertically in a z-direction.

5. The keyboard of claim 1, wherein the keycap flange and case web flange are angled.

6. The keyboard of claim 1, wherein the keycap flange comprises a polyethylene terephthalate polymer sheet attached to a bottom surface of the keycap.

7. A keyboard, comprising:
   a keycap assembly, comprising:
      a keycap having a keycap flange attached to a bottom perimeter of the keycap;
      a scissor-type mechanism for supporting the keycap;
      a rubber dome underneath the keycap for providing tactile feel to a user;
      a layered membrane with switch circuit;
      a base plate for support of the keycap assembly; and
      a backlight light source underneath the base plate; and
   a case web in which the keycap assembly is mounted, the case web comprising intersecting ribs that have case web flanges, wherein the keycap flange and case web flanges overlap but do not contact each other such that the backlight light source cannot be directly seen by the user.

8. The keyboard of claim 7, wherein the scissor type mechanism can control a height of the keycap when the keycap is pushed down by the user.

9. The keyboard of claim 1, wherein the keycap assembly further comprises:
   a vertical stop pin attached to a pivot center of the scissor type mechanism; and
   a stopping mechanism for restricting vertical motion of the vertical stop pin at a predetermined distance from the base plate.

10. The keyboard of claim 9, wherein the stopping mechanism is a hook attached to a base plate to capture the vertical stop pin.

11. The keyboard of claim 9, wherein the vertical stop pin and stopping mechanism can directly stop the scissor type mechanism from moving vertically in a z-direction.

12. The keyboard of claim 7, wherein the keycap flange and case web flange are angled.

13. The keyboard of claim 7, wherein the keycap flange comprises a polyethylene terephthalate polymer sheet attached to a bottom surface of the keycap.

14. A method of making a backlit keyboard, the method comprising:
    providing a base plate having a backlight light source underneath the base plate;
    engaging the base plate with a scissor type mechanism;
    engaging the scissor type mechanism with a keycap having a keycap flange around a perimeter of a base of the keycap; and
    positioning a case web over the keycap such that a case web flange corresponds to the keycap flange without contacting the keycap flange, wherein an overlap of the case web flange and the keycap flange prevent a user from directly seeing the backlight light source.

15. The method of claim 14, wherein the keycap flange and the case web flange are angled.

16. The method of claim 14, wherein the scissor type mechanism is rotatably engaged with the keycap.

17. The method of claim 16, wherein engaging the scissor type mechanism comprises snapping linkage structures of the scissor type mechanism into features on an underside of the keycap.

18. The method of claim 17, wherein the features are grooves on the underside of the keycap.

19. The method of claim 14, further comprising attaching a rubber dome to the base plate.

20. The method of claim 19, wherein attaching the rubber dome comprises positioning a concave dome portion of the rubber dome over contact pads of a membrane on the base plate.

21. The method of claim 14, wherein the case web flange is formed by chamfering a surface of the case web.

\* \* \* \* \*